United States Patent [19]
Zampaglione

[11] Patent Number: 5,349,552
[45] Date of Patent: Sep. 20, 1994

[54] MEMORY COMPILER WITH MULTIPLE SELECTABLE CORE ELEMENTS

[75] Inventor: Michael A. Zampaglione, San Jose, Calif.

[73] Assignee: VLSI Technology, Inc., San Jose, Calif.

[21] Appl. No.: 811,401

[22] Filed: Dec. 20, 1991

[51] Int. Cl.$^5$ ................................................ G11C 5/02
[52] U.S. Cl. ........................................ 365/51; 365/63
[58] Field of Search ..................................... 365/51, 63

[56] References Cited

U.S. PATENT DOCUMENTS

| | | | |
|---|---|---|---|
| 4,525,809 | 6/1985 | Chiba | 365/63 |
| 4,964,078 | 10/1990 | Jandu | 365/63 |
| 5,040,143 | 8/1991 | Matsumura | 365/63 |
| 5,101,376 | 3/1992 | Noguchi | 365/49 |
| 5,121,355 | 6/1992 | Gubbels | 365/51 |

OTHER PUBLICATIONS

VLSI Technology, Inc., "2–Micro Silicon Compilers", pp. CROMO1-1, CROM-1-10 through CROMO1-13. *Microelectronics Digital and Analog Circuits and Systems,* by Jacob Millman, Ph.D., 1979 "McGraw-Hill", pp. 193–199 and 276–279.

*Primary Examiner*—Eugene R. LaRoche
*Assistant Examiner*—A. Zarabian
*Attorney, Agent, or Firm*—Burns, Doane, Swecker & Mathis

[57] ABSTRACT

Methods and devices for efficiently using substrate space to form memory devices on integrated circuits, and in particular, in application specific integrated circuits. More particularly, a shared decoder and control logic are used for selectively accessing and addressing plural types of memory (e.g., RAM and ROM cells). Further, each memory cell of a memory array is programmed as a particular type of memory cell during circuit layout design. Therefore, specific rows, columns, or single bits of the memory cell array can be designated as specific types of memory.

12 Claims, 1 Drawing Sheet

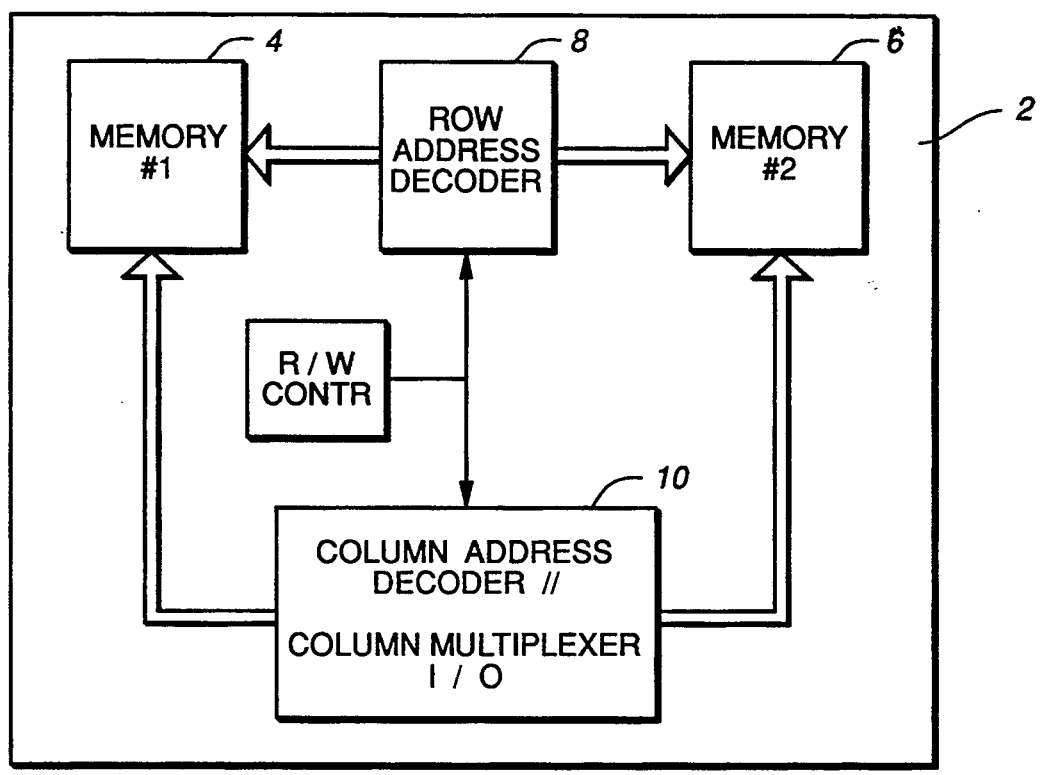
FIG._1
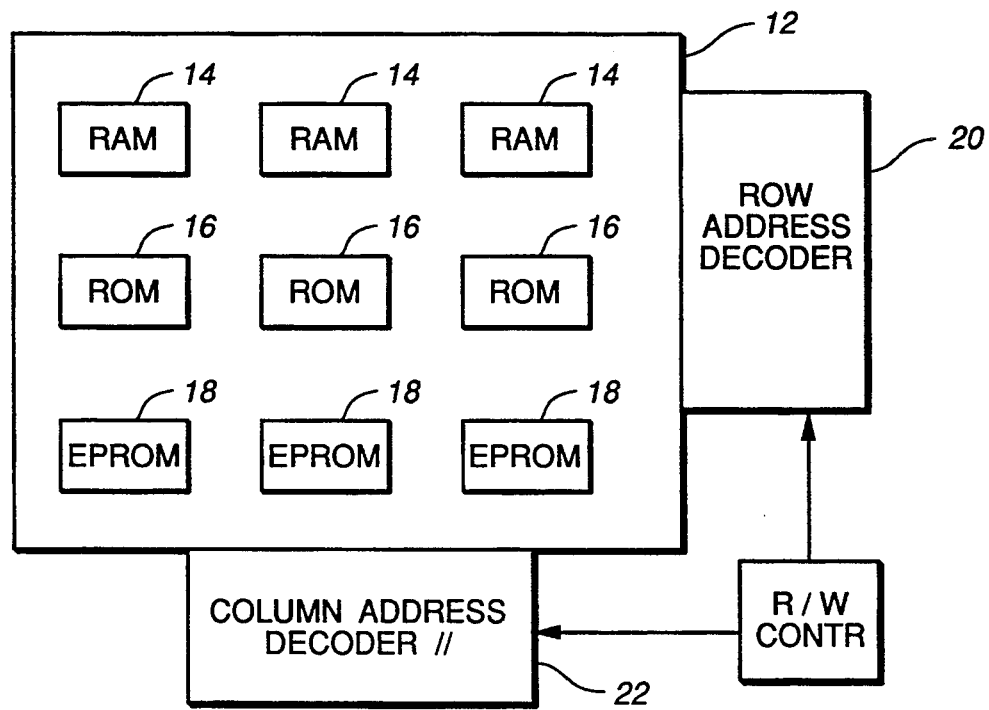
FIG._2

MEMORY COMPILER WITH MULTIPLE SELECTABLE CORE ELEMENTS

BACKGROUND OF THE INVENTION

1. Field of the Invention

The present invention relates generally to the design of integrated circuits. More particularly, the present invention relates to the design of integrated circuits having more than one type of memory.

2. State of the Art

Memory devices such as random access memories (RAMS) or read only memories (ROMS) have been readily available for some time. For example, these memories are described in *Microelectronics Digital and Analog Circuits and Systems*, by Jacob Millman, Ph.D, 1979: McGraw-Hill. ROMs are non-volatile read only devices, while RAMs are volatile read and write devices. Both types of memory devices are typically designed as arrays of memory cells with decoding and control circuitry located about their peripheries.

A typical RAM cell is formed as a flip-flop wherein two inverters are cross-coupled. A typical ROM cell, by way of contrast, is formed by a single bipolar or MOS transistor to establish a logic "0" state or alternately, is formed as an open circuit to establish a logic "1" state. Thus, individual ROM cells are approximately one-tenth the size of individual RAM cells.

Decoding circuitry permits a particular row and column of the memory array to be addressed. For example, a row decoder decodes an input address to access a particular row of cells in the memory cell array. A column decoder decodes an input address to control a multiplexer that selectively accesses a column in the memory cell array. Thus, a cell located at the intersection of an addressed row and column can be selectively accessed.

Control circuitry provides selective input/output control of the memory array. For example, a RAM includes read/write control circuitry for selectively enabling the output (i.e., read) or input (i.e., write) of data from or into an addressed cell or series of cells.

Quite often circuit layouts are designed wherein plural types of memory are necessary to optimize circuit operation, cost-effectiveness or space requirements. For example, a non-volatile ROM device might be used to store the basic operating instructions or program of a microprocessor included in the circuit layout. Because ROMs are non-volatile storage devices, they retain information stored therein even in the absence of circuit power. On the contrary, a volatile RAM might be used by the microprocessor for writing and reading information and data obtained during program execution.

Typically, a circuit designed to include plural types of memory is fabricated by acquiring a discrete component for each type of memory device. For example, a RAM chip and a separate ROM chip are placed on a printed circuit board and interconnected with other circuit components.

More recently, application specific integrated circuits (ASICs) have been developed whereby different types of memory devices are formed as part of one integrated circuit (e.g., formed on a single substrate). In designing ASICs which require plural types of memory, each type of memory is typically formed as an individual area on the ASIC. For example, if an ASIC is to include both a RAM and a ROM, the ASIC is designed to include an array of RAM cells surrounded by RAM decode and control circuitry. An array of ROM cells is separately designed with its own decode and control circuitry.

The foregoing ASIC designs suffer significant drawbacks which limit their effective use of substrate space on an ASIC. For example, because an individual RAM cell is typically ten times larger than an individual ROM cell, circuit layouts have been designed with reduced RAM memory for saving space.

However, circuit layout designs with minimized RAM and increased ROM possess significant disadvantages. In addition to losing read and write capability, such designs cannot effectively exploit the aforementioned space savings during placement and routing of the circuit layout.

For example, because ROM cells are relatively small, ROM decoder and control circuitry represents a relatively large fraction of the ROM's overall space requirements. Larger ROMs tend to be relatively long and narrow with row decoder circuitry located along one side. Such an irregular configuration must be one of the first circuit components placed by a compiler into the circuit layout design. Subsequent placement of other circuit components is severely restricted, often resulting in increased overall dimensions of the ASIC.

Accordingly, circuit layouts are designed by estimating the amount of RAM space required. However, the flexibility of ASIC designs is limited when an exact amount of available RAM or ROM space is pre-allotted to promote efficient use of a substrate area. Pre-allocation of memory space may result in a memory shortage, thus limiting application of the circuit layout.

Additional RAM space is therefore often included in a circuit layout design to account for unexpected memory requirements which may occur during subsequent use of the circuit layout. Valuable circuit layout space may therefore be wasted by providing additional memory space and attendant decoder and control circuitry which is never actually used.

Accordingly, there is a need for ASIC designs that more effectively place memory in available circuit layout space and that offer enhanced flexibility without limiting applicability of the circuit layout.

SUMMARY OF THE INVENTION

To address the foregoing need, the present invention relates to methods and devices for providing space-efficient use of circuit layouts. In a preferred embodiment, a shared decoder and control logic is used to selectively access and address plural types of memory cells (e.g., RAM and ROM cells). Further, the structure or architecture of each memory cell in a memory array can be programmed as a particular type of memory cell during circuit layout design. Specific rows and/or columns of the memory cell array can therefore be designated as specific types of memory.

The reduced space requirements associated with use of less decoder and control circuitry permits the design of smaller ASICs. Alternately, additional memory cells can be included in a given ASIC, thus enhancing flexibility and applicability of the ASIC. Further, the combination of plural types of memory cells (e.g., RAM and ROM cells) in a single array permits the formation of regular configurations which can be more easily placed and routed in a circuit layout.

BRIEF DESCRIPTION OF THE DRAWINGS

Other objects and advantages of the present invention will become more apparent from the following discussion of preferred embodiments when read in conjunction with the accompanying drawings, wherein like elements have been assigned like reference numerals, and wherein:

FIG. 1 is an exemplary illustration of a circuit layout formed in accordance with the invention; and, FIG. 2 is an exemplary illustration of a memory formed in accordance with the invention.

DETAILED DESCRIPTION OF THE PREFERRED EMBODIMENTS

As mentioned previously, memory devices typically include an array of memory cells. Each cell stores a single bit of digital information. Rows of memory cells can be grouped to store a series of bits of information referred to as a word. Each column of the memory therefore represents a given bit location for each word stored in memory.

FIG. 1 shows a circuit layout 2 upon which circuit components are placed. It will be appreciated that the circuit layout 2 can be a printed circuit board formed with discrete components. In a preferred embodiment, the circuit layout is formed on the single substrate of an ASIC to further minimize space requirements. Therefore, it will be assumed for purposes of the following discussion that the FIG. 1 circuit layout is an ASIC formed using well known fabrication techniques.

In FIG. 1, a first portion of a memory array included in the circuit layout 2 is allocated to a first memory 4. It will be appreciated that the memory 4 can be an array of memory cells corresponding to any known memory device, such as a RAM, ROM, EPROM (erasable programmable ROM) or EEPROM (electrically erasable programmable ROM). For purposes of discussion, the memory device 4 is labelled memory "A" and will be considered a ROM.

A second portion of the memory array included in the circuit layout 2 is allocated to a second memory 6. This second memory constitutes a second array of cells, different from the cells of memory device 4. For purposes of discussion, the memory device 6 is labelled memory "B" and will be considered a RAM.

A third portion of the circuit layout is allocated to decoder and control logic which is shared by the first and second portions of the memory array. More particularly a row address decoder 8 is included in the circuit layout. The row address decoder must be capable of addressing the most complex type of memory cell included in the circuit layout. As referenced herein, the phrase "most complex" refers to the type of memory cell in a given circuit layout which requires the greatest amount of decoding and control circuitry.

For example, because ROMs are read only devices, write control circuitry is not required. On the contrary, RAMs must include write as well as read control circuitry. Further, certain types of RAM cells require a refreshing charge at regular intervals to restore capacitance leakage. Accordingly, any row decoder and control circuitry required for writing into cells of a RAM must be included as control circuitry in the row address decoder 8.

Similarly, a column address decoder must provide read and write capability. A column address decoder is represented as element 10 in the FIG. 1 circuit layout and includes a multiplexer which is controlled by a decoded column address. Further, the column address decoder includes read and write circuitry for selectively gating information from addressed memory cells to an output bus.

Because common row and column decoders are shared between two different types of memory, an address used to access a given cell must further identify whether the cell is in the memory array A or B. A bit location (or locations) of the address can be used to specify whether the RAM or ROM array of FIG. 1 is being accessed. Additional bit locations can be used to address a specific cell location in the array of memory cells identified. Alternately, cell locations of the two memory arrays can be sequentially numbered so that no two cell locations have the same address. However, this latter format is less preferred since it is likely to increase the address size and thus increase the decoding and control circuitry.

FIG. 2 shows a more preferred method and structure for including memory on an ASIC. In FIG. 2, a single memory device 12 is formed on an ASIC substrate. The memory device is formed with memory cells allocated to at least two different types of memories. For example, the memory device 12 has been designed to include at least one row of RAM memory cells represented by the cells 14, at least one row of ROM memory cells, represented by the cells 16, and at least one row of EPROM cells represented by the cells 18.

Each of the cells are formed as known cells of their respective type using conventional semiconductor fabrication techniques. However, because the memory array 12 includes cells allocated to different types of memory, a format is required to identify which type of cell structure (e.g., RAM or ROM) is to be created in each addressable location of the array. Typically, a ROM is programmed using a code file which identifies a cell location. The code file further identifies whether a "1" or "0" is to be stored at that location. In accordance with a preferred embodiment, the code file is also used to identify the type of memory cell to be fabricated in a given bit location formed on an ASIC substrate.

Specific bit locations in the code file are used to identify whether a specific cell location is to be fabricated as a RAM or ROM cell. For example, an "R" can be added to the code file to specify that a given cell in the array is to be designed as a RAM bit location. An "E" can be used to specify an EPROM, and so forth.

To produce the FIG. 2 circuit layout, a memory array can be designed by allocating enough space to each cell location to form the largest type of memory cell to be used in the array. For example, where only ROM and RAM cells are to be included, the memory can be designed to accommodate an array of the larger RAM cells. Any number of the RAM cell locations can then be redefined as ROM bit locations.

In a preferred embodiment, similar type memory cells are grouped in rows or columns to further reduce memory space requirements. For example, if an entire row or column of cells can be allotted to ROM cells, then the size (i.e., height or width, respectively) of that row or column can be reduced during placement and routing of the memory array. However, grouping by row or column is not required; in practice, the code file can be used to determine the cell type of any bit.

As with FIG. 1, the FIG. 2 circuit layout is formed with row address decoder and control circuitry 20 and column address decoder and control circuitry 22. The decoder and control circuitry is designed to access the most complex type of memory cell included in the memory array as described previously.

The foregoing has described the principles, preferred embodiments and modes of operation of the present invention. However, the present invention should not be construed as being limited to the particular embodiments discussed. Accordingly, the above-described embodiments should be regarded only as illustrative, and it should be appreciated that workers skilled in the art may make variations in those embodiments without departing from the spirit and scope of the invention as defined by the following claims.

What is claimed is:

1. A method for designing a memory array comprising the steps of:
   establishing a code file to identify whether individual cell locations of the memory array are to be fabricated as a first type of cell or as a second type of cell;
   allocating a first portion of a circuit layout to memory cells of said first type;
   allocating a second portion of the circuit layout to memory cells of said second type; and,
   allocating a third portion of the circuit layout to decoder and control logic, the decoder and control logic being shared by the first portion and the second portion.

2. A method according to claim 1, wherein the first portion and the second portion are formed as a single array of memory cells.

3. A method according to claim 1, wherein the decoder and control logic accesses memory cells by addressing the first and second portion.

4. A method according to claim 1, wherein the step of allocating a second portion further includes a step of redefining memory cells of the first type as memory cells of the second type, the second type representing a memory cell which is of smaller size than a memory cell of the first type.

5. A method according to claim 1, wherein the first type of memory cells are random access memory cells.

6. A method according to claim 1, wherein the second type of memory cells are read only memory cells.

7. A method according to claim 1, wherein the steps of allocating first and second portions each include a step of creating data for storage in said code file for at least one memory cell, the code file identifying characteristics of the at least one memory cell.

8. A method according to claim 1, wherein the step of allocating a second portion further includes a step of identifying at least one row, one column, or single bit of the first portion as memory cells of the second type.

9. A method of fabricating plural cell locations of a memory array which includes plural types of memory cell structures comprising the steps of:
   identifying at least two different types of memory cells to be fabricated in the plural cell locations of the memory array;
   addressing at least one cell location in the memory array with a cell location address that includes a code to identify the type of memory cell to be fabricated in the cell location.

10. A memory device for storing digital information comprising:
    a memory array including a first type of memory cells and a second type of memory cells; and
    means for controlling access to the memory cells, the controlling means further including means for addressing a cell location by identifying the type of memory cell which is to be accessed.

11. Memory device according to claim 10 wherein the memory array is formed on a single substrate.

12. Memory device according to claim 11, wherein at least one row or column in the memory array of the memory device comprises the first type of memory cells, and at least one other row or column in the memory array comprises the second type of memory cells.

* * * * *